(12) United States Patent
Kim

(10) Patent No.: US 9,646,719 B2
(45) Date of Patent: May 9, 2017

(54) MEMORY DEVICE, METHOD OF GENERATING LOG OF COMMAND SIGNALS/ADDRESS SIGNALS OF MEMORY DEVICE, AND METHOD OF ANALYZING ERRORS OF MEMORY DEVICE

(71) Applicant: Samsung Electronics Co., Ltd., Suwon-si (KR)

(72) Inventor: Kwang-Hyun Kim, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/968,898

(22) Filed: Dec. 15, 2015

(65) Prior Publication Data
US 2016/0172060 A1    Jun. 16, 2016

(30) Foreign Application Priority Data
Dec. 16, 2014    (KR) .......................... 10-2014-0181512

(51) Int. Cl.
G06F 3/06        (2006.01)
G11C 29/56       (2006.01)
G11C 8/18        (2006.01)
G11C 11/4076     (2006.01)
G11C 29/04       (2006.01)

(52) U.S. Cl.
CPC .......... *G11C 29/56012* (2013.01); *G11C 8/18* (2013.01); *G11C 11/4076* (2013.01); *G11C 2029/0401* (2013.01)

(58) Field of Classification Search
CPC .................................................... G06F 3/0659
USPC ........................................................ 711/111
See application file for complete search history.

(56) References Cited

U.S. PATENT DOCUMENTS

| 5,410,710 | A | * | 4/1995 | Sarangdhar | G06F 15/17 710/264 |
| 5,912,847 | A | | 6/1999 | Tamaki | |
| 6,219,771 | B1 | * | 4/2001 | Kikuchi | G06F 3/0601 711/164 |
| 8,281,042 | B2 | | 10/2012 | Son et al. | |
| 8,301,829 | B2 | | 10/2012 | Lee | |
| 2007/0208910 | A1 | * | 9/2007 | Koseki | G06F 3/061 711/114 |
| 2012/0182812 | A1 | * | 7/2012 | Bae | G11C 7/22 365/189.05 |
| 2013/0322160 | A1 | | 12/2013 | Kim et al. | |
| 2014/0047167 | A1 | | 2/2014 | Kwak | |
| 2014/0063971 | A1 | | 3/2014 | Lee et al. | |
| 2014/0089574 | A1 | | 3/2014 | Sohn et al. | |

(Continued)

*Primary Examiner* — Min Huang
(74) *Attorney, Agent, or Firm* — Muir Patent Law, PLLC

(57) ABSTRACT

A memory device includes first and second memory cell arrays, a first controller, and a second controller. The first controller controls the first memory cell array through first word line signals and first bit line signals to execute an operation corresponding to a command signal based on an address signal and a data signal. The second controller includes first and second mode registers. The second controller writes sampled values of the address signal and the command signal to the second memory cell array through access signals to form a log in response to stored values of the first and second mode registers or reads stored values of the second memory cell array as the data signal through the access signals.

19 Claims, 13 Drawing Sheets

(56) References Cited

U.S. PATENT DOCUMENTS

2014/0250353 A1* 9/2014 Choi ................... G06F 11/1048
                                                            714/800
2014/0297939 A1   10/2014 Perego et al.
2016/0117099 A1*  4/2016 Prins ................... G06F 11/1441
                                                            711/103

* cited by examiner

MEMORY DEVICE, METHOD OF GENERATING LOG OF COMMAND SIGNALS/ADDRESS SIGNALS OF MEMORY DEVICE, AND METHOD OF ANALYZING ERRORS OF MEMORY DEVICE

CROSS-REFERENCE TO RELATED APPLICATION

This U.S. Non-provisional application claims priority under 35 USC §119 to Korean Patent Application No. 10-2014-0181512, filed on Dec. 16, 2014, in the Korean Intellectual Property Office (KIPO), the disclosure of which is incorporated by reference in its entirety herein.

BACKGROUND

Generally, a semiconductor memory device such as DRAM (Dynamic Random Access Memory) may be tested with a lot of test benches to detect faults of circuits at both the wafer level and package level. Because, in a practical sense, test coverage of a semiconductor memory device cannot be 100%, a semiconductor memory device that passes a test may still generate errors during user operation.

When the semiconductor memory device is attached to a printed circuit board (PCB), an error of the semiconductor memory device may be found based on a dump result of signals on pins connecting the semiconductor memory device and the PCB. The dump result may be obtained by a logic analyzer through connecting probes of the logic analyzer to the pins.

Mobile DRAM included in recently developed embedded systems may be mounted on an SoC (System-on-Chip) in PoP (Package on Package) form and the SoC may be mounted on the PCB of the embedded system. In this case, because internal pins connecting the mobile DRAM and the SoC are not exposed to the outside, it may be impossible to observe signals on the internal pins through the logic analyzer such that it may be difficult to detect certain errors of the embedded system.

SUMMARY

At least one example embodiment of the inventive concept provides a memory device storing a log of command signals and address signals, which are inputted during operation of the memory device, to a memory cell array included in the memory device.

At least one example embodiment of the inventive concept provides a method of storing a log of command signals and address signals, which are inputted during operation of a memory device, to a memory cell array included in the memory device.

At least one example embodiment of the inventive concept provides a method of storing a log of command signals and address signals, which are inputted during operation of a memory device, to a memory cell array included in the memory device and analyzing errors of the memory device by using the log of the command signals and the address signals.

According to example embodiments, a memory device includes first and second memory cell arrays, a first controller, and a second controller. The first controller controls the first memory cell array through first word line signals and first bit line signals to execute an operation corresponding to a command signal based on an address signal and a data signal. The second controller includes first and second test mode registers. The second controller writes sampled values of the address signal and the command signal to the second memory cell array through access signals to form a log, and reads stored values of the second memory cell array as the data signal through the access signals in response to stored values of the first and second mode registers. The stored values correspond to at least one of address signals and command signals.

In an example embodiment, the second controller may include a plurality of flip-flops generating the sampled values by sampling the address signal and the command signal using a synchronization signal.

In an example embodiment, the synchronization signal may be a clock signal and the address signal and command signal are sampled at at least one of a rising edge and a falling edge of the clock signal.

In an example embodiment, the second controller may write the sampled values to the second memory cell array through the access signals when each of the stored values of the first and second test mode registers is a first logic value.

In an example embodiment, the second controller may read the stored values of the second memory cell array as the data signal through the access signals when the stored value of the first test mode register is a first logic value and the stored value of the second test mode register is a second logic value.

In an example embodiment, the second controller and the second memory cell array may not operate when the stored value of the first test mode register is a second logic value.

In an example embodiment, the first controller and the first memory cell array may always operate irrespective of the stored values of the first and second test mode registers.

In an example embodiment, the access signals may include second word line signals and second bit line signals. The second controller may include an address generator, a row decoder, and a column decoder. The address generator may generate a row address signal and a column address signal based on the stored values of the first and second test mode registers. The row decoder may activate a word line based on the row address signal and a second word line signal corresponding to the address indicated in the row address signal. The column decoder may activate some bit lines corresponding to the column address signal. The column decoder may drive the activated bit lines as the sampled value in response to the stored values of the first and second test mode registers. The column decoder may receive stored values of memory cells, which are included in the second memory cell array and correspond to the row address signal and the column address signal, through the activated bit lines and output the stored values of the memory cells as the data signal.

In an example embodiment, the column decoder may drive the activated bit lines signals with the sampled values when each of the stored values of the first and second test mode registers is a first logic value.

In an example embodiment, the column decoder may receive the stored values of the memory cells through the activated bit lines and output the stored values of the memory cells as the data signal when the stored value of the first test mode register is a first logic value and the stored value of the second test mode register is a second logic value.

In an example embodiment, the address generator may include a counter outputting a count value. The address generator may generate the row address signal and the column address signal based on the count value and the stored values of the first and second test mode registers.

In an example embodiment, the counter may initialize the count value when the stored value of the first test mode register is a second logic value.

In an example embodiment, the counter may increase the count value sequentially at every rising edge or falling edge of a synchronization signal when the stored value of the first test mode register is a first logic value.

In an example embodiment, each of the row address signal and the column address signal may increase or decrease sequentially.

In an example embodiment, the command signal may include a write enable signal, a row address strobe signal, a column address strobe signal, and a chip selection signal.

According to example embodiments, a method of generating a log of a command signal and an address signal of a memory device, which includes a first memory cell array and a second memory cell array, includes an executing an operation corresponding to the command signal to memory cells, which are included in the first memory cell array and correspond to the address signal; and a writing the command signal and the address signal to the second memory cell array.

According to example embodiments, the method may further include a reading stored value of the second memory cell array as the log of the command signal and the address signal; and a storing the log of the command signal and the address signal to an external memory device.

According to some embodiments, the memory device further includes a mode register storing values that indicate whether to write the command signal and the address signal to the second memory cell array, or to read data representing a command signal and an address signal from the second memory cell array.

According to some example embodiments, a method of operating a memory device that includes at least a first memory cell array and a second memory cell array is described. The method includes controlling the first memory cell array through first word line signals and first bit line signals to execute an operation corresponding to a command signal based on an address signal and a data signal, writing sampled values of the address signal and the command signal to the second memory cell array through access signals to form a log, and reading stored values of the second memory cell array, the stored values corresponding to at least one of address signals and command signals. Wherein writing the sampled values and reading the stored values may be controlled by values stored in one or more mode registers.

According to some embodiments, the method additionally includes reading the stored values of the second memory cell array when a first value stored in a first mode register of the one or more mode registers is a first logic value and a second value stored in a second mode register of the one or more mode registers is a second logic value, and writing the sampled values to the second memory cell array when the first value stored in the first mode register of the one or more mode registers is the first logic value and the second value stored in the second mode register of the one or more mode registers is the first logic value.

According to some embodiments, the method includes preventing operation of the second memory cell array when the first value stored in the first mode register is the second logic value.

In certain embodiments, the first memory cell array always operates irrespective of the values stored in the first and second mode registers.

In certain embodiments, the controlling, reading, and writing are controlled by one or more controllers of the memory device.

BRIEF DESCRIPTION OF THE DRAWINGS

Example embodiments of the inventive concept will be more clearly understood from the following detailed description taken in conjunction with the accompanying drawings.

DETAILED DESCRIPTION

Figure 1:
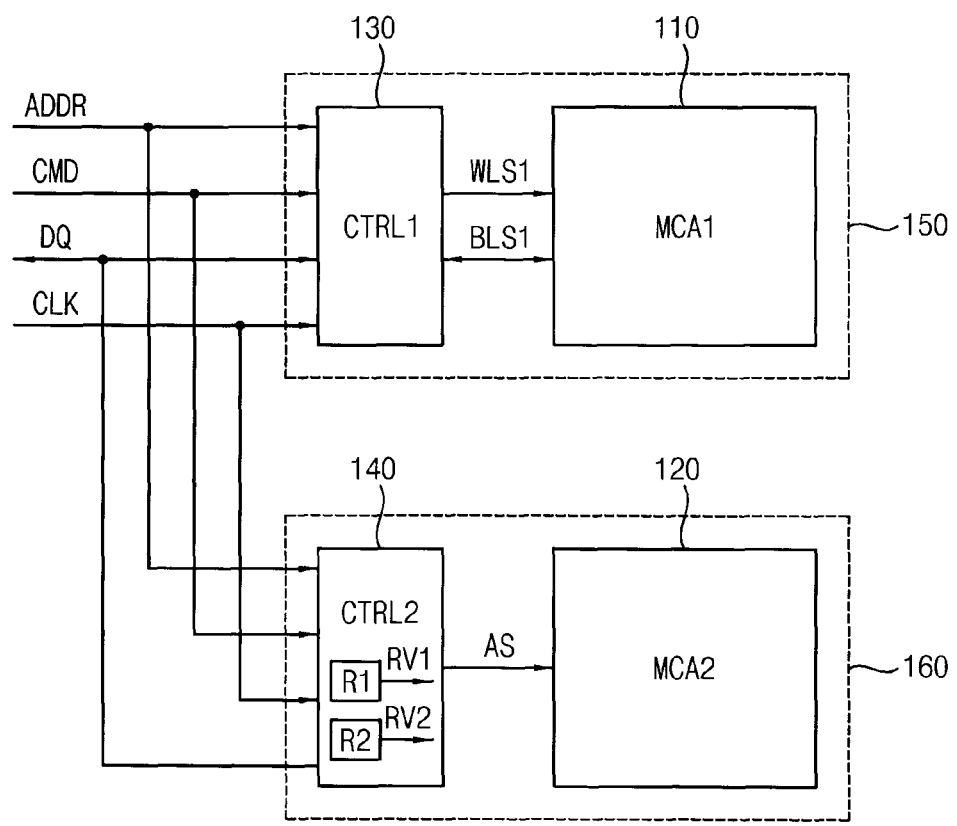
FIG. 1 is a block diagram illustrating a memory device according to an example embodiment.

Various example embodiments will be described more fully hereinafter with reference to the accompanying drawings, in which some example embodiments are shown. The present inventive concept may, however, be embodied in many different forms and should not be construed as limited to the example embodiments set forth herein. These exemplary embodiments are just that—examples—and many implementations and variations are possible that do not require the details provided herein. It should also be emphasized that the disclosure provides details of alternative examples, but such listing of alternatives is not exhaustive.

Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are generally used to distinguish one element from another, and may or may not indicate an order or position of steps/elements, depending on how the terms are used. Thus, unless the context indicates otherwise, a first element discussed below in one portion of the specification or claims could be termed a second element in another portion of the specification or claims without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory device according to an example embodiment.

Referring to FIG. 1, a memory device 100 includes a first sub circuit 150 (also described as a first circuit 150) and a second sub circuit 160 (also described as a second circuit 160). The first sub circuit 150 includes a first controller CTRL1 130 and a first memory cell array MCA1 110. The second sub circuit 160 includes a second controller CTRL2 140 and a second memory cell array MCA2 120. The second controller 140 includes a first test mode register R1 and a second test mode register R2.

As described herein, a memory device may include a semiconductor chip, such as a semiconductor memory chip formed of a die from a wafer and having a memory array included thereon. A memory device may also include a stack of memory chips, for example, formed in a semiconductor package that includes a package substrate on which the stack of memory chips are mounted. A memory device may also refer to a portion of a semiconductor chip, such as one or more banks connected to one or more respective control circuits on a semiconductor chip.

The first controller 130 controls (e.g., includes a circuit configured to control) the first memory cell array 110 through first word lines signals WLS1 and first bit line signals BLS1 to execute an operation corresponding to a command signal CMD based on an address signal ADDR and a data signal DQ. The second controller 140 writes (e.g., includes a circuit configured to write) sampled values of the address signals ADDR and the command signals CMD to the second memory cell array 120 through access signals AS or reads (e.g., includes a circuit configured to read) stored values of the second memory cell array 120 as the data signals DQ through the access signals AS in response to stored values RV1 and RV2 of the first and second test mode registers R1 and R2. An example of the first controller 130 will be described in greater detail with reference to FIG. 2.

The second controller 140 may include a plurality of flip-flops configured to generate the sampled values by sampling an address signal ADDR and a command signal CMD at a rising edge or a falling edge of a synchronization signal. The synchronization signal may be a clock signal CLK. Hereinafter, an example where the synchronization signal is the clock signal CLK will be shown. The second controller 140 will be described with the reference to FIG. 3 and the plurality of the flip-flops will be described with the reference to FIG. 4.

In an example embodiment, a first logic value may be a logic high value and a second logic value may be a logic low value. In another example embodiment, the first logic value may be a logic low value and the second logic value may be a logic high value.

The stored value RV1 of the first test mode register R1 may represent whether the second controller 140 and the second memory cell array 120 operate or not. In certain embodiments, the second controller 140 and the second memory cell array 120 are configured to operate when the stored value RV1 of the first test mode register R1 is the first logic value. As such, the stored value RV1 with the first logic value may control the second memory cell array 120 to be in an operational state. In certain embodiments, the second controller 140 and the second memory cell array 120 are configured to not operate when the stored value RV1 of the first test mode register R1 is the second logic value. As such, the stored value RV1 with the second logic value may control the second memory cell array 120 to be in a non-operational state.

The stored value RV2 of the second test mode register R2 may represent whether the second controller 140 and the second memory cell array 120 are to execute a write operation or a read operation. For example, the second controller 140 may write the sampled value to the second memory cell array 120 through the access signals AS when the stored value RV2 of the second test mode register R2 is the first logic value. The second controller 140 may read stored values of the second memory cell array 120 as the data signal DQ through the access signal AS when the stored value RV2 of the second test mode register R2 is the second logic value.

In an example embodiment, the first controller 130 and the first memory cell array 110 may operate irrespective of the stored values RV1 and RV2 of the first and second test mode registers R1 and R2.

In an example embodiment, the command signal CMD may include a write enable signal /WE, a row address strobe signal /RAS, a column address strobe signal /CAS, and a chip selection signal /CS.

Figure 2:
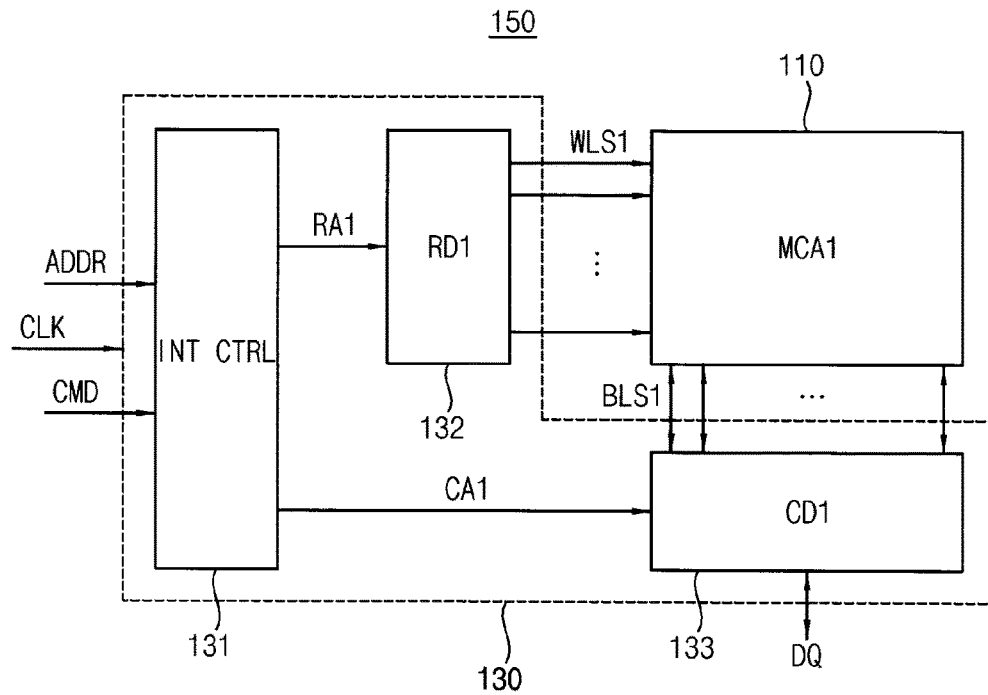
FIG. 2 is a block diagram illustrating the first sub circuit included in the memory device of FIG. 1, according to an example embodiment.

FIG. 2 is a block diagram illustrating the first sub circuit included in the memory device of FIG. 1, according to certain exemplary amendments.

Referring to FIG. 2, the first sub circuit 150 may include the first controller 130 (also referred to as a first control circuit) and the first memory cell array 110. The first controller 130 may include an internal controller INT CTRL 131 (also referred to as an internal control circuit), a first row decoder RD1 132, and a first column decoder CD1 133.

The internal controller 131 may control operation of the first sub circuit 150. For example, the internal controller 131 may generate control signals such that the first sub circuit 150 executes a write operation or a read operation. The internal controller 131 may include a command decoder, which decodes the command signal CMD, and a mode register, which sets an operation mode of the first sub circuit 150. Though the first controller 130 of FIGS. 1 and 2 are depicted as separate controllers from the second controller 140 of FIGS. 1 and 3, these controllers may operate as a single controller or single control circuit.

The first memory cell array 110 may include a plurality of memory cells operating in response to the first word line signals WLS1 and the first bit line signals BLS1. The first memory cell array 110 may be divided into a plurality of memory blocks, and each of the plurality of the memory blocks may include a plurality of pages. The memory cell array 110 may comprise a single memory bank or sub-bank, or a plurality of banks or sub-banks, and may be implemented on one memory chip or a plurality of memory chips.

The first row decoder 132 may select one of the plurality of the pages included in the first memory cell array 110 by activating a word line signal corresponding to the first row address signal RA1 among the first word line signals WLS1 by decoding the first row address signal RA1 provided from the internal controller 131.

The first column decoder 133 may activate some bit line signals corresponding to the first column address signal CA1 provided from the internal controller 131 among the first bit line signals BLS1. The first column decoder 133 may drive the some bit line signals with the data signal DQ or may receive stored values of memory cells, which are included in the first memory cell array 110 and correspond to the first row address signal RA1 and the first column address signal CA1, through the some bit line signals, and output the stored values of the memory cells as the data signal DQ.

In some embodiments, the first sub circuit 150 of FIG. 2 may have the same or similar structure as conventional memory devices.

Figure 3:
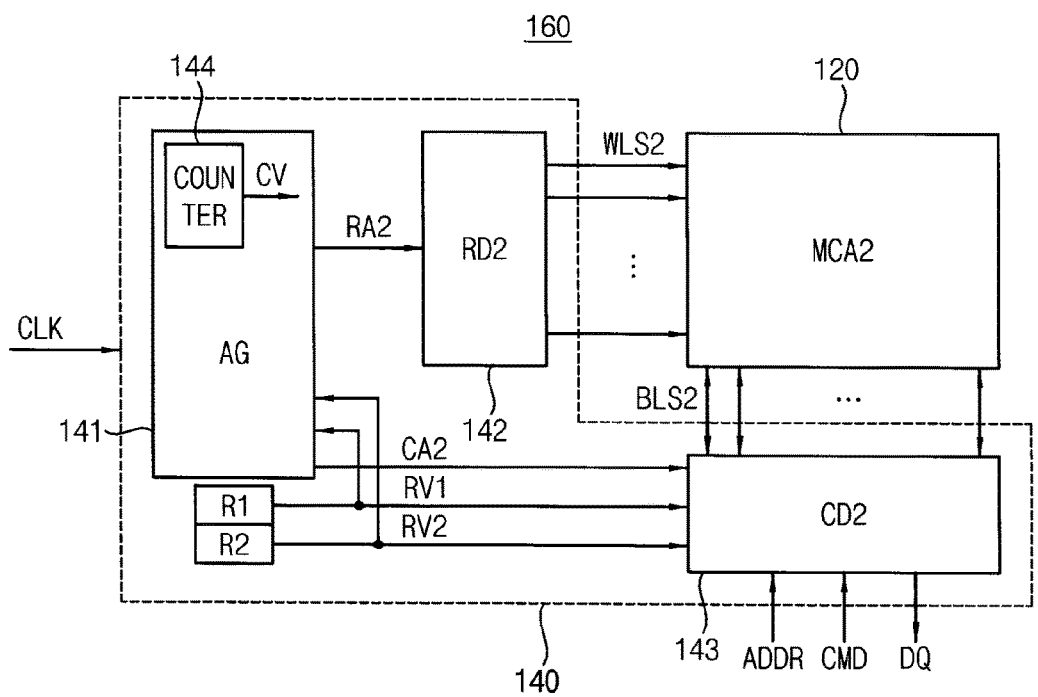
FIG. 3 is a block diagram illustrating the second sub circuit included in the memory device of FIG. 1, according to an example embodiment.

FIG. 3 is a block diagram illustrating the second sub circuit included in the memory device of FIG. 1, according to certain exemplary embodiments.

Referring to FIG. 3, the second sub circuit 160 includes the second controller 140 (also referred to as the second control circuit) and the second memory cell array 120. The second controller 140 includes an address generator AG 141, a second row decoder RD2 142, a second column decoder CD2 143, a first test mode register R1, and a second test mode register R2. The access signals for accessing the second memory cell array 120 of the memory device 100 of FIG. 1 may include the second word line signals WLS2 and the second bit line signals BLS2. The address generator 141 may include a counter 144 outputting a count value CV.

The address generator 141 may generate the second row address signal RA2 and the second column address signal CA2 based on the count value CV and the stored values RV1 and RV2 of the first and second test mode registers R1 and R2. In an example embodiment, the counter 144 may initialize or reset the count value CV when the stored value RV1 of the first test mode register R1 is a second logic value. In an example embodiment, the counter 144 may increase or decrease the count value CV sequentially at every rising edge or every falling edge of the clock signal CLK when the stored value RV1 of the first test mode register R1 is a first logic value. Or in another example embodiment, the counter 144 may increase or decrease the count value CV sequentially at every rising edge and every falling edge of the clock signal CLK when the stored value RV1 of the first test mode register R1 is a first logic value (e.g., using a double data rate type clock).

In an example embodiment, each of the second row address signal RA2 and the second column address signal CA2 may increase or decrease sequentially.

The second row decoder 142 may activate a word line signal corresponding to the second row address signal RA2 among the second word line signals WLS2. The second column decoder 143 may activate some bit line signals corresponding to the second column address signal CA2 among the second bit line signals BLS2. The second column decoder 143 may drive the some bit line signals with the sampled value of the address signal ADDR and the command signal CMD, or may receive stored values of memory cells, which are included in the second memory cell array 120 and correspond to the second row address signal RA2 and the second column address signal CA2, through the some bit line signals and output the stored values of the memory cells as the data signal DQ in response to the stored values RV1 and RV2 of the first and second test mode registers R1 and R2.

For example, in certain embodiments, the second column decoder 143 may drive the some bit line signals as the sampled values when each of the stored values RV1 and RV2 of the first and second test mode registers R1 and R2 is a first logic value. In an example embodiment, the second column decoder 143 may receive stored values of the memory cells, which are included in the second memory cell array 120 and correspond to the second row address signal RA2 and the second column address signal CA2, through the some bit line signals and output the stored values of the memory cells as the data signal DQ when the stored value RV1 of the first test mode register R1 is a first logic value and the stored value RV2 of the second test mode register R2 is a second logic value.

Figure 4:
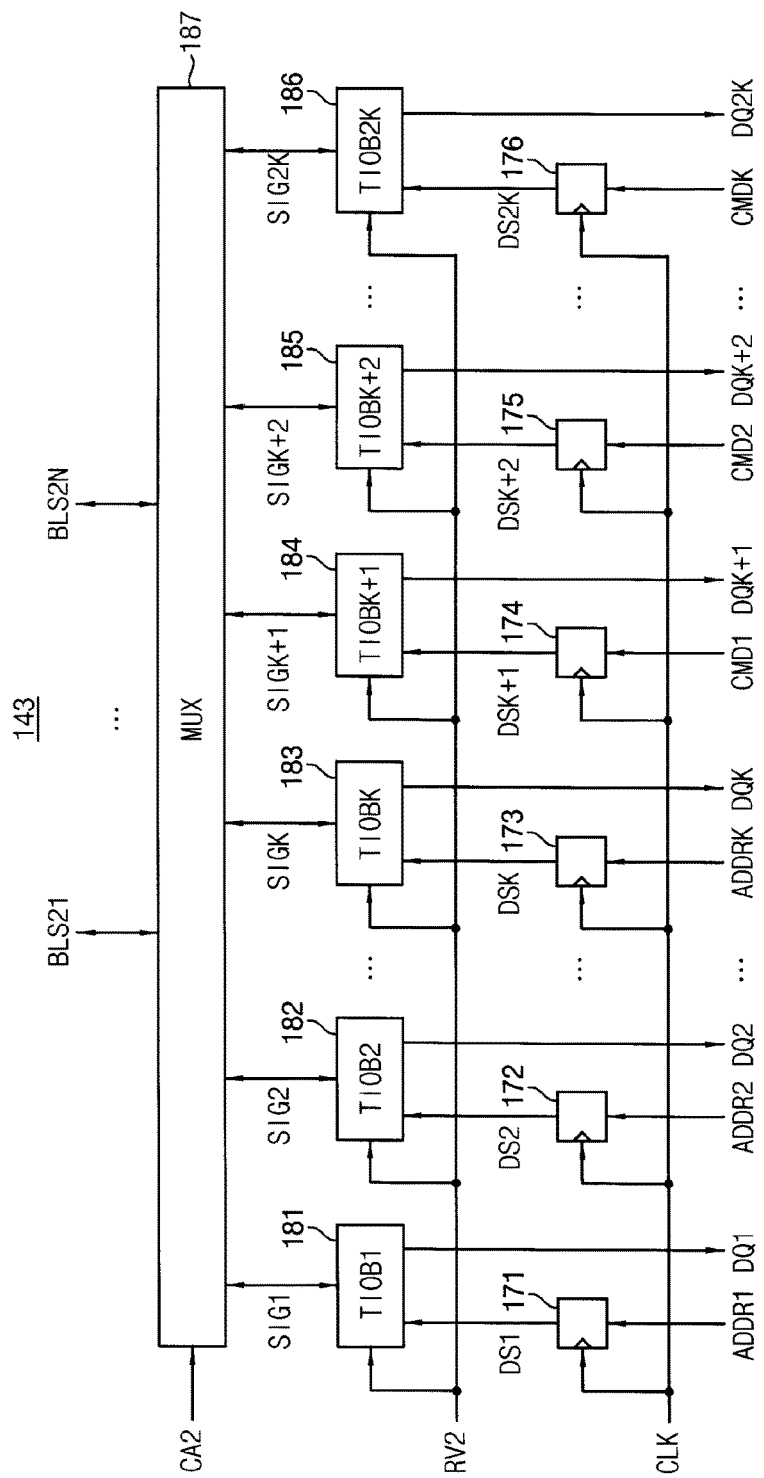
FIG. 4 is a block diagram illustrating the second column decoder included in the second sub circuit of FIG. 3, according to an example embodiment.

FIG. 4 is a block diagram illustrating the second column decoder included in the second sub circuit of FIG. 3, according to certain exemplary embodiments.

Referring to FIG. 4, the second column decoder 143 includes a plurality of flip-flops 171 through 176, a plurality of bi-directional buffers 181 through 186 (TIOB1, TIOB2 through TIOBK, TIOBK+1, TIOBK+2 through TIOB2K), and a multiplexer MUX 187.

The multiplexer 187 may map first through (2K)-th internal signals SIG1, SIG2 through SIGK, SIGK+1, SIGK+2 through SIG2K to some bit line signals among the second bit line signals BLS21 through BLS2N based on the second column address signal CA2, respectively. For example, in one embodiment, N is equal to 8K, and CA2 is a two bit value that counts from 0 to 3 in a repeated manner. In this case, a first set of SIG0 to SIG2K signals arrives at MUX 187 when CA2 is 0, and as a result, first data of signals SIG0 to SIG2K is output as a first set of signals on a first set of 2K bit lines. Next, a second set of signals SIG0 to SIG2K arrives at MUX 187 when CA2 is 1, and as a result, second data of signals SIG0 to SIG2K is output as a second set of signals on a second set of 2K bit lines (on the same word line as the first data). This is repeated for a third set of signals SIG0 to SIG2K and a fourth set of signals SIG0 to SIG2K. This may fill an entire word line of memory cells of second memory cell array 120, and as a result, a row of data is written to a page (e.g., a row of memory cells connected to a word line) in second memory cell array 120. This page may store, for example, four sets of address-command pairings that correspond to addresses and commands used to write to or read from four rows of memory cells in first memory cell array 110. After a first page is stored, RA2 may increment, which may cause subsequent addresses and commands to be stored in a different row of second memory cell array 120.

The plurality of flip-flops 171 through 176 may generate the sampled values DS1, DS2 through DSK, DSK+1, DSK+2 through DSK2K by sampling the address signal ADDR1, ADDR2 through ADDRK and the command signal CDM1, CMD2, and CMDK at a rising edge or a falling edge of the clock signal CLK. K may be an integer greater than 2.

The plurality of the bi-directional buffers 181 through 186 drive the first through (2K)-th internal signals SIG1, SIG2 through SIGK, SIGK+1, SIGK+2 through SIG2K as the sampled values DS1, DS2 through DSK, DSK+1, DSK+2 through DSK2K when the stored value RV2 of the second test mode register R2 is the first logic value. The plurality of the bi-directional buffers 181 may output the first through (2K)-th internal signals SIG1, SIG2 through SIGK, SIGK+1, SIGK+2 through SIG2K as the data signal DQ1, DQ2 through DQK, DQK+1, DQK+2 through DQ2K when the stored value RV2 of the second test mode register R2 is the second logic value.

Although 2K data lines (bits) are shown for the signal DQ, and K address lines and K command lines are shown, these are merely examples, and other amounts of lines or ratios of lines can be used. For example, there may be a greater number of data lines (e.g., 4K) compared to address lines (e.g., K), and command lines (e.g., K). The command lines may be fewer than the address lines. Different combinations of amounts of lines and/or ratios of numbers of the different types of lines may be used to implement the disclosed embodiments.

Figure 5:
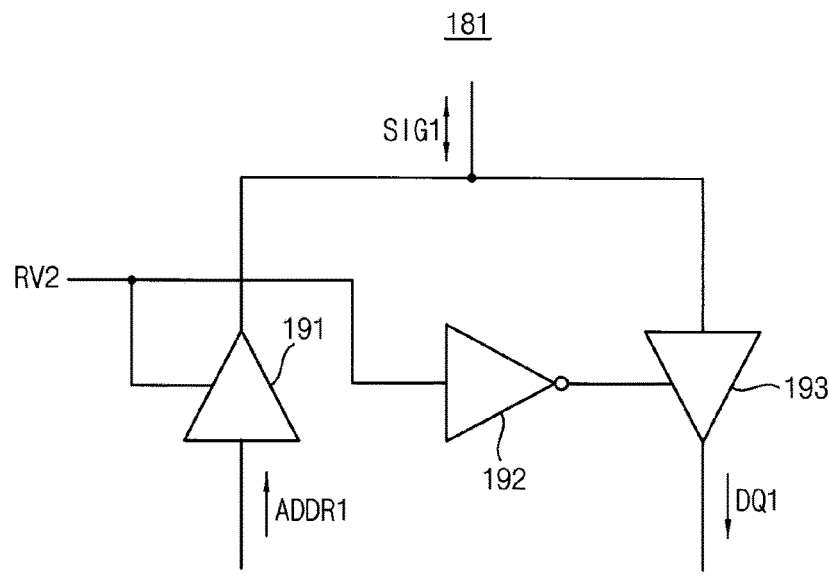
FIG. 5 is a circuit diagram illustrating the first bi-directional buffer included in the second column decoder of FIG. 4, according to an example embodiment.

FIG. 5 is a circuit diagram illustrating the first bi-directional buffer included in the second column decoder of FIG. 4, according to certain exemplary embodiments.

Referring to FIG. 5, the first bi-directional buffer 181 may include first and second tri-state buffer 191 and 193, and an inverter 192.

The first tri-state buffer 191 operates as a buffer and the second tri-state buffer 193 operates as open circuit when the stored value RV2 of the second test mode register R2 is the first logic value. In this case, the first tri-state buffer 191 drives the first internal signal SIG1 as a first bit signal ADDR1 of the address signal ADDR. The first tri-state buffer 191 operates as open circuit and the second tri-state buffer 193 operates as a buffer outputting the first internal signal SIG1 as the first bit signal DQ1 of the data signal DQ when the stored value RV2 of the second test mode register R2 is the second logic value.

Figure 6:
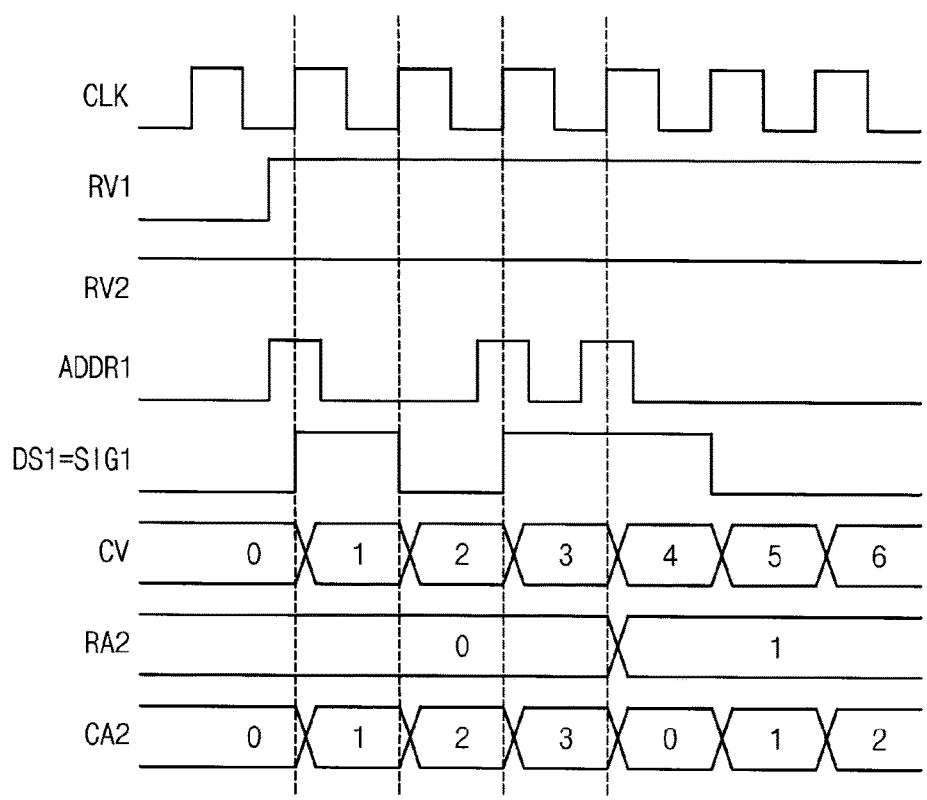
FIG. 6 is a timing diagram illustrating operation of signals of the second sub circuit of FIG. 3, according to an example embodiment.

FIG. 6 is a timing diagram illustrating operation of signals of the second sub circuit of FIG. 3.

FIG. 6 shows write operation when the second row address signal RA2 and the second column address signal CA2 are 2 bit signals, respectively. An example is given only for one bit of an address signal. To execute the write operation, the second sub circuit 160 writes the first bit signal ADDR1 of the address signal ADDR to the second memory cell array 120. As can be seen, after RV1 transitions to a high logic state, the counter CV begins such that address data is sampled and written to the memory cell array 120. More specifically, at each rising clock signal CLK after RV1 transitions to a high logic state, the value of the address bit ADDR1 is output as the signal SIG1. Additional detailed operation of the second sub circuit 160 may be understood based on the reference to FIG. 6.

As described above, based on the collective signals SIG1 to SIG2K and the second column address signal CA2, pages of the second memory cell array 310 may be written to with address and command data. As a result, as described further below, the second memory cell array 310 may function as a log that keeps track of addresses that have been accessed and how they have been accessed (e.g., written to, read from, erased, refreshed, etc.)

Figure 7:
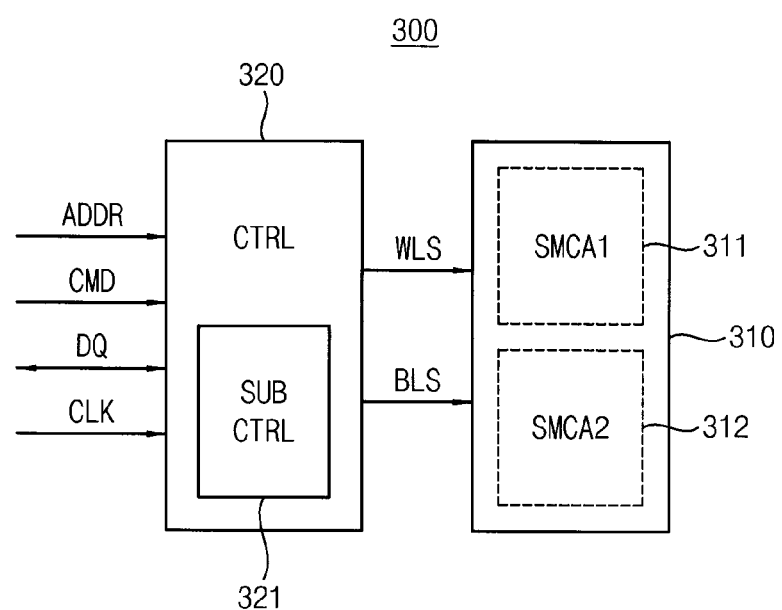
FIG. 7 is a block diagram illustrating a memory device according to an example embodiment.

FIG. 7 is a block diagram illustrating a memory device according to another example embodiment.

Referring to FIG. 7, a memory device 300 includes a controller CTRL 320 and a memory cell array 310. The memory cell array 310 includes a first sub memory cell array SMCA1 311 and a second sub memory cell array SMCA2 312. The controller 320 includes a sub controller SUB CTRL 321.

The controller 320 controls the first sub memory cell array 311 through word line signals WLS and bit line signals BLS to execute an operation corresponding to a command signal CMD based on the address signal ADDR and the data signal DQ. In an example embodiment, the controller 320 and the first sub memory cell array 311 may correspond to the first controller 130 and the first memory cell array 110 of FIG. 2, respectively.

The sub controller 321 may write the sampled values of the address signal ADDR and the command signal CMD to the second sub memory cell array 312 through the word line signals WLS and the bit line signals BLS or may read stored values of the second sub memory cell array 312 as the data signal DQ through the word line signals WLS and the bit line signals BLS in response to the stored values of the first and second test mod registers. In an example embodiment, the sub controller 321 and the second sub memory cell array 312 may correspond to the second controller 140 and the second memory cell array 120 of FIG. 3, respectively.

Figure 8:
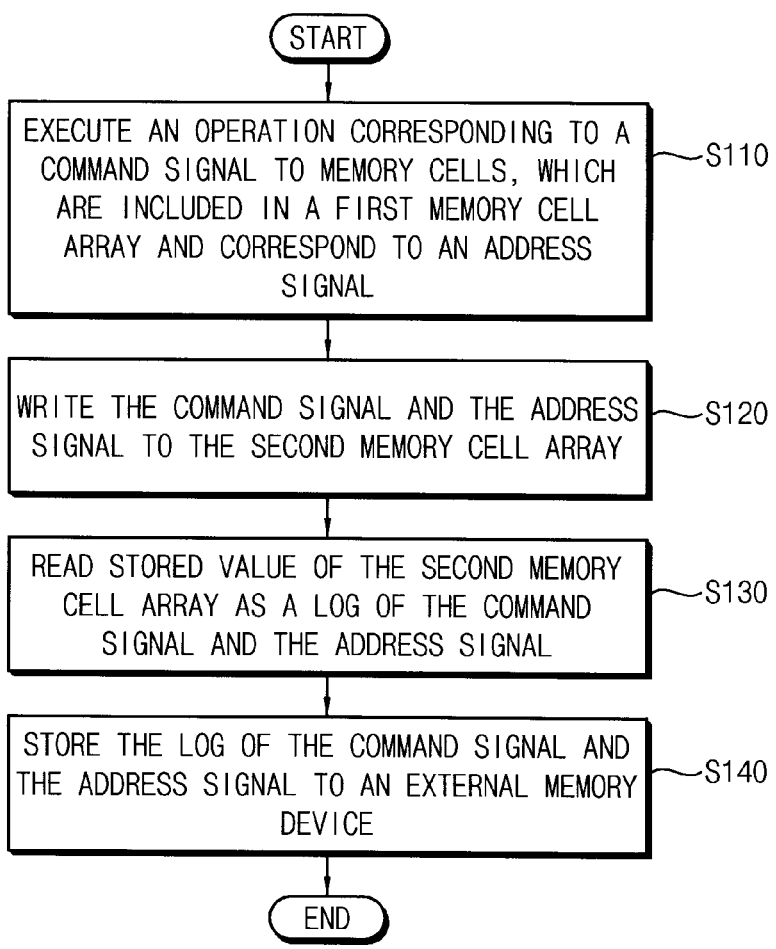
FIG. 8 is a flow chart illustrating a method of generating a log of a command signal and an address signal of a memory device according to an example embodiment.

FIG. 8 is a flow chart illustrating a method of generating a log of a command signal and an address signal of a memory device according to an example embodiment.

Referring to FIG. 8, a method of generating a log of a command signal and an address signal of a memory device, which includes a first memory cell array and a second memory cell array, includes executing an operation corresponding to the command signal to memory cells, which are included in the first memory cell array and correspond to the address signal (S110); writing the command signal and the address signal to the second memory cell array (S120);

reading a stored value of the second memory cell array as a log of the command signal and the address signal (S130); and storing the log of the command signal and the address signal to an external memory device (S140). For example, entries in the second memory cell array may form a log of stored addresses and commands, and different parts of the log may be read from the second memory cell array and transmitted to an external memory device for storage.

The steps (S110 through S140) may be understood based on the references to FIGS. 1 through 7.

Figure 9:
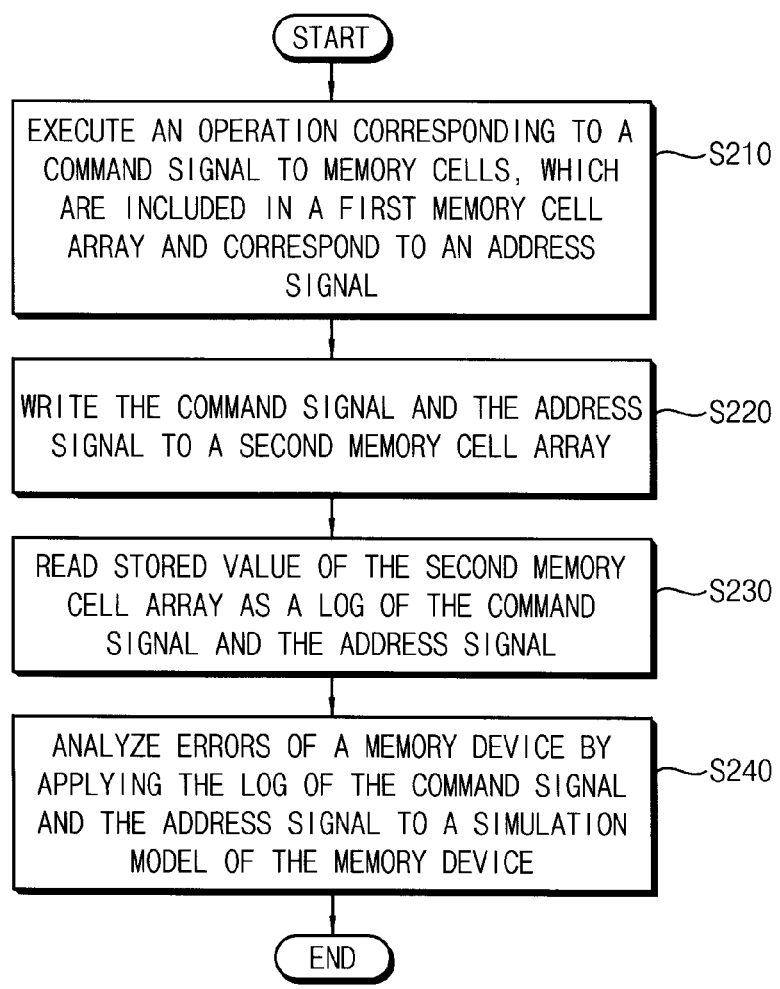
FIG. 9 is a flow chart illustrating a method of analyzing error of the memory device according to an example embodiment.

FIG. 9 is a flow chart illustrating a method of analyzing error of the memory device according to an example embodiment.

Referring to FIG. 9, a method of analyzing errors of a memory device, which includes a first memory cell array and a second memory cell array, includes executing an operation corresponding to a command signal to memory cells, which are included in the first memory cell array and correspond to an address signal (S210); writing the command signal and the address signal to the second memory cell array (S220); reading a stored value of the second memory cell array as a log of the command signal and the address signal (S230); and analyzing the errors of the memory device by applying the log of the command signal and the address signal to a simulation model of the memory device (S240).

The steps (S210 through S240) may be understood based on the references to FIGS. 1 through 7.

Figure 10:
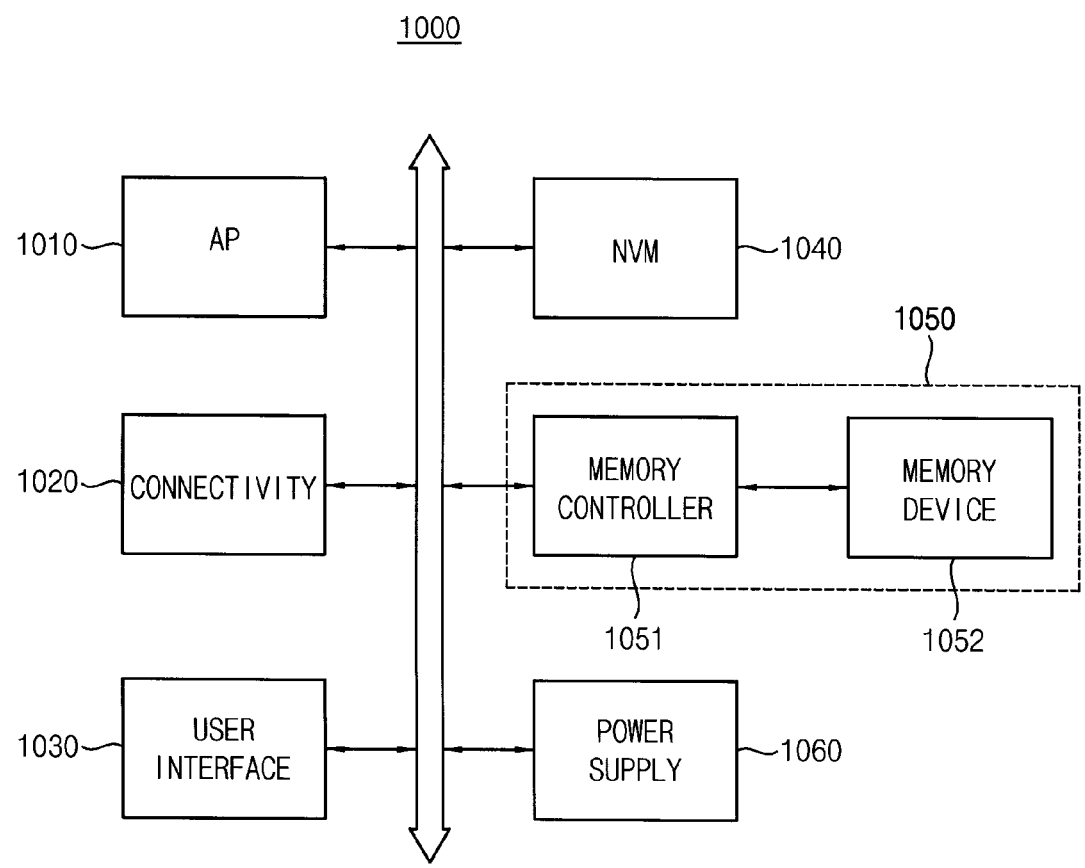
FIG. 10 is a diagram illustrating a mobile system applying a memory device according to an example embodiment.

FIG. 10 is a diagram illustrating a mobile system applying a memory device according to an example embodiment.

Referring to FIG. 10, a mobile system 1000 includes an application processor 1010, a connectivity unit 1020, a user interface 1030, a nonvolatile memory device NVM 1040, a memory system 1050 and a power supply 1060. In some embodiments, the mobile system 1000 may be a mobile phone, a smart phone, a personal digital assistant (PDA), a portable multimedia player (PMP), a digital camera, a music player, a portable game console, a navigation system, etc.

The application processor 1010 may execute applications, such as a web browser, a game application, a video player, etc. In some embodiments, the application processor 1010 may include a single core or multiple cores. For example, the application processor 1010 may be a multi-core processor, such as a dual-core processor, a quad-core processor, a hexa-core processor, etc. The application processor 1010 may include an internal or external cache memory.

The connectivity unit 1020 may perform wired or wireless communication with an external device. For example, the connectivity unit 1020 may perform Ethernet communication, near field communication (NFC), radio frequency identification (RFID) communication, mobile telecommunication, memory card communication, universal serial bus (USB) communication, etc. In some embodiments, connectivity unit 1020 may include a baseband chipset that supports communications, such as global system for mobile communications (GSM), general packet radio service (GPRS), wideband code division multiple access (WCDMA), high speed downlink/uplink packet access (HSxPA), etc.

The memory system 1050 may include a memory controller 1051 and a memory device 1052. The memory device 1052 may store data processed by the application processor 1010, or may operate as a working memory. The memory device 1052 may include a memory cell array having a plurality of memory blocks. Each of the memory blocks may include a plurality of pages.

The memory device 1052 may be embodied with one of the memory devices 100 and 300 of FIGS. 1 and 7. Operation and structure of the memory device 1052 may be understood based on the references to FIGS. 1 through 7.

The nonvolatile memory device 1040 may store a boot image for booting the mobile system 1000. For example, the nonvolatile memory device 1040 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1030 may include at least one input device, such as a keypad, a touch screen, etc., and at least one output device, such as a speaker, a display device, etc. The power supply 1060 may supply a power supply voltage to the mobile system 1000.

In some embodiments, the mobile system 1000 may further include an image processor, and/or a storage device, such as a memory card, a solid state drive (SSD), a hard disk drive (HDD), a CD-ROM, etc.

In some embodiments, the mobile system 1000 and/or components of the mobile system 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 11:
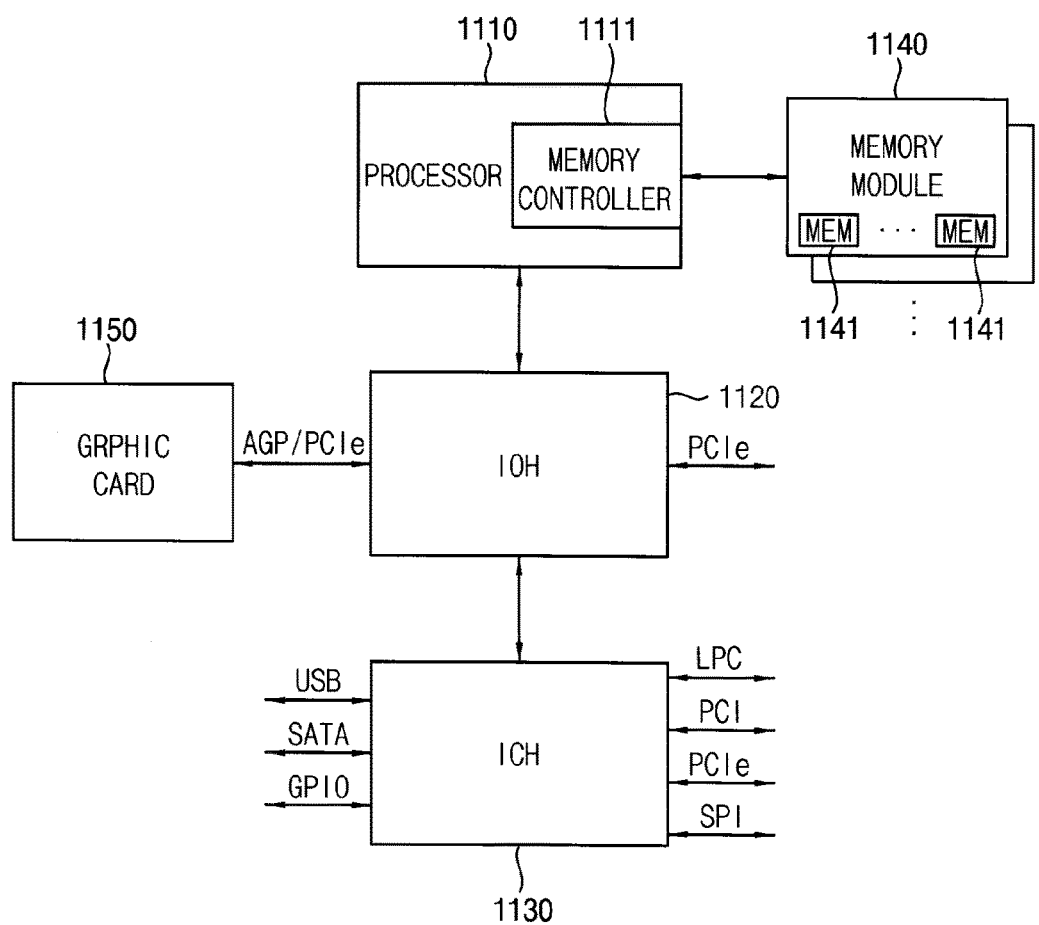
FIG. 11 is a diagram illustrating a computing system according to an example embodiment.

FIG. 11 is a diagram illustrating a computing system according to an example embodiment.

Referring to FIG. 11, a computing system 1100 includes a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 11 illustrates the computing system 1100 including one processor 1110, in some embodiments, the computing system 1100 may include a plurality of processors.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120. The input/output hub 1120 including the memory controller 1111 may be referred to as memory controller hub (MCH).

The memory module 1140 may include a plurality of memory devices MEM 1141 that store data provided from the memory controller 1111. The memory device 1141 may include a memory cell array having a plurality of memory blocks. Each of the memory blocks may include a plurality of pages.

Each of the plurality of memory devices 1141 may be embodied with one of the memory devices 100 and 300 of FIGS. 1 and 7. Operation and structure of the memory device 1141 may be understood based on the references to FIGS. 1 through 7.

The input/output hub 1120 may manage data transfer between processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a Quick-Path interconnect (QPI), a common system interface (CSI), etc. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc. Although FIG. 11 illustrates the computing system 1100 including one input/output hub 1120, in some embodiments, the computing system 1100 may include a plurality of input/output hubs.

The graphics card 1150 may be coupled to the input/output hub 1120 via AGP or PCIe. The graphics card 1150 may control a display device for displaying an image. The graphics card 1150 may include an internal processor for processing image data and an internal memory device. In some embodiments, the input/output hub 1120 may include an internal graphics device along with or instead of the graphics card 1150 outside the graphics card 1150. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc.

The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

Figure 12:
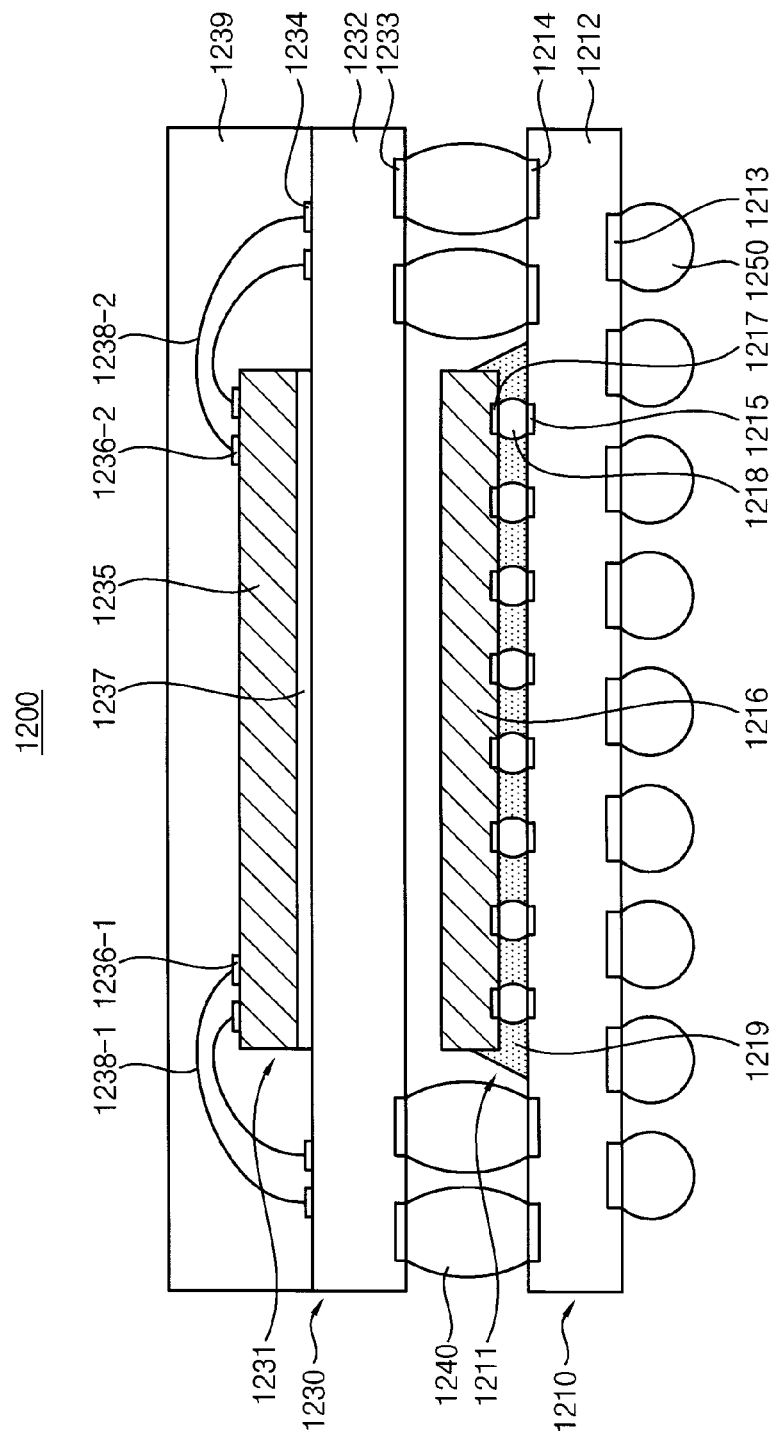
FIG. 12 is a diagram illustrating a semiconductor package of PoP (Package on Package) structure according to an example embodiment.

FIG. 12 is a diagram illustrating a semiconductor package of PoP (Package on Package) structure according to an example embodiment.

Referring to FIG. 12, the semiconductor package 1200 includes the first package 1210, the second package 1230, and connection member 1240 between substrates. The semiconductor package 1200 may have PoP (Package on Package) structure such that the second package 1230 may be stacked on the first package 1210.

The first package 1210 may include the first substrate 1212 and the first semiconductor chip portion 1211. The first substrate 1212 may support the first semiconductor chip portion 1211. The first substrate 1212 may include pads on the upper and lower surfaces. For example, the lower pad 1213 may be formed on the lower surface of the first substrate 1212, and the upper pad 1214 and the intermediate pad 1215 may be formed on the upper surface of the first substrate 1212. The first substrate 1212 may be formed with silicon, glass, ceramic, or plastic.

The first substrate 1212 may be formed based on an active wafer or an interposer substrate. The active wafer refers to a wafer from which a semiconductor chip may be formed. The first substrate 1212 may include multi-layered wiring pattern structure (not shown) inside. The upper pad 1214, the intermediate pad 1215, and the lower pad 1213 may be electrically connected through the multi-layered wiring pattern structure. An external connection member 1250 for mounting a semiconductor package on an external device may be formed on the lower pad 1213 on the lower surface of the first substrate 1212.

The first semiconductor chip portion 1211 may include the first semiconductor chip 1216, the connection member 1218, and the underfill 1219. Chip pad 1217 is formed on the lower surface of the first semiconductor chip 1216, The first semiconductor chip 1216 may be mounted on the first substrate 1212 in a flip-chip form via the connection member 1218 attached to the chip pad 1217, respectively. That is, the connection member 1218 physically and electrically connects the chip pad 1217 and the intermediate pad 1215.

The underfill 1219 may be filled between the first semiconductor chip 1216 and the first substrate 1212. The underfill 1219 may be formed of an underfill resin, e.g., an epoxy resin, and may include a silica filler or a flux.

If necessary, an adhesive member may be formed between the first semiconductor chip 1216 and the first substrate 1212, instead of the underfill 1219. The adhesive member may be formed of, for example, a non-conductive film (NCF), an anisotropic conductive film (ACF), an ultraviolet (UV) ray film, an instant adhesive, a thermal-curable adhesive, a laser-curable adhesive, a supersonic wave-curable adhesive, or a non-conductive paste (NCP).

The second package 1230 may include the second substrate 1232, the second semiconductor chip portion 1231, and a sealing material 1239.

The second substrate 1232 may be formed of silicon, glass, ceramic, or plastic, like the first substrate 1212. The second substrate 1232 may include pads on the upper and lower surfaces. For example, the connection pad 1233 may be formed on the lower surface of the second substrate 1232, and the bonding pad 1234 may be formed on the upper surface of the second substrate 1232. The second substrate 1232 may include multi-layered wiring pattern structure (not shown) inside, too. The bonding pad 1234 and the connection pad 1233 may be electrically connected through the multi-layered wiring pattern structure.

The second semiconductor chip portion 1231 may include the second semiconductor chip 1235 and the adhesive 1237.

Chip pads 1236-1 and 1236-2 may be formed on the upper surface of the second semiconductor chip 1235, and the chip pads 1236-1 and 1236-2 may be disposed on one edge of the second semiconductor chip 1235 and on another edge of the second semiconductor chip 220 according to channels. For example the chip pads 1236-1 and 1236-2 may be disposed on a right edge and a left edge of the second semiconductor chip 1235 according to channels, respectively.

The chip pads 1236-1 and 1236-2 and the bonding pad 1234 may be electrically connected through the wires 1238-1 and 1238-2. As such, the second semiconductor chip 1235 may be mounted on the second substrate 1232 in a wire bonding type. Left chip pads 1236-1 and the wires 1238-1 may correspond to the first channel, and right chip pads 1236-2 and the wires 1238-2 may correspond to the second channel. Channel and arrange structure of chip pads will be described with the references to FIGS. 13 and 14.

The adhesive 1237 may attach the second semiconductor chip 1235 on the second substrate 1232. The adhesive 1237 may be the NCF, the UV ray film, the instant adhesive, the terminal-curable adhesive, the laser-curable adhesive, the supersonic wave-curable adhesive, or the NCP.

The sealing material 1239 seals the second semiconductor chip 1235 and the wires 1238-1 and 1238-2. The sealing material 1239 may be formed of a polymer such as a resin. For example, the sealing material 1239 may be formed of an epoxy molding compound EMC. The connection member 1240 between substrates physically and electrically connects the upper pad 1214 of the first substrate 1212 and the connection pad 1233 of the second substrate 1232 to each other, and makes the first and second packages 1210 and 1230 structurally firm. The connection member 1240 between substrates may be formed of, for example, a solder ball. However, the material for forming the connection member 1240 is not limited to the solder ball.

FIG. 12 shows a case where the first semiconductor chip portion 1211 and the second semiconductor chip portion 1231 respectively include only one semiconductor chip. However, the present inventive concept is not limited thereto. The first semiconductor chip portion 1211 and the second semiconductor chip portion 1231 may further include at least one semiconductor chip, respectively. The first semiconductor chip 1216 and the second semiconductor chip 1235 may be the same kind of semiconductor chips or different kinds of chips. For example, the first semiconductor chip 1216 may be a logic chip, and the second semiconductor chip 1235 may be a memory chip. The logic chip may be a micro-processor, for example, a central processing unit (CPU), a controller, an application specific integrated circuit (ASIC).

The first semiconductor chip 1216 may be an application processor (AP) chip of a System on Chip (SoC) type used in a mobile system, for example, a mobile phone, an MP3 player, a navigation device, or a portable multi-media player (PMP).

The memory chip may be a volatile memory, e.g., a dynamic random access memory (DRAM) and a static random access memory (SRAM), or a non-volatile memory, e.g., a flash memory.

The second semiconductor chip 1235 may be a double data rate (DDR) synchronous dynamic random access memory (SDRAM) chip (hereinafter, referred as a DDR chip) used in a mobile system.

The memory device 100 of FIG. 1 may be embodied with the second semiconductor chip 1235. As described above, even though probes of the logic analyzer cannot physically reach to all pads connecting the first semiconductor chip 1216 and the second semiconductor chip 1235 such that it's hard to debug errors of the memory device 100 using the logic analyzer, the memory device 100 according to example embodiments may write a log of command signals/address signals provided to the memory device 100 to a portion of the memory cell array, may read the log of the command signals/address signals, and may analyze errors of the memory device 100 by applying the log of the command signal/the address signal to the simulation model of the memory device 100. The memory device 300 of FIG. 7 may be embodied with the second semiconductor chip 1235.

Figure 13:
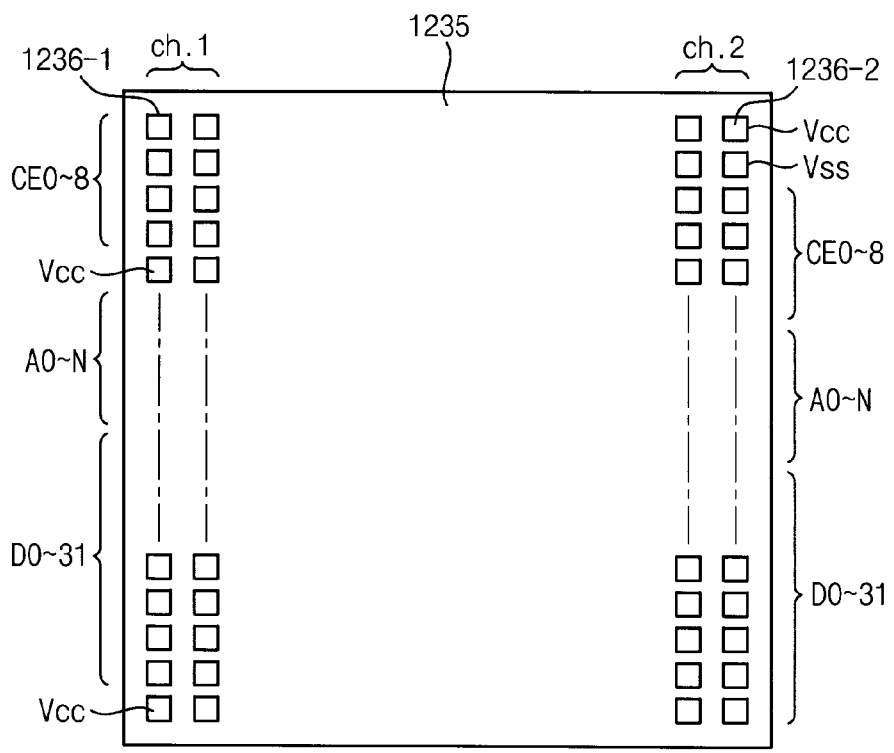
FIG. 13 is a diagram illustrating pad arrangement of a semiconductor chip of the second package included in the semiconductor package of FIG. 10, according to an example embodiment.

FIG. 13 is a diagram illustrating pad arrangement of a semiconductor chip of the second package included in the semiconductor package of FIG. 12, according to certain exemplary embodiments.

Referring to FIG. 13, the second semiconductor chip 1235 included in the semiconductor package 1200 may be the previously described DDR chip. The first chip pads 1236-1 for first channel Ch. 1 may be formed at a left edge of the second semiconductor chip 1235 and the second chip pads 1236-2 for the second channel Ch. 2 may be formed at a right edge of the second semiconductor chip 1235.

The first channel Ch. 1 and the second channel Ch. 2 are respectively channels for 32 bits, and accordingly, each of the first chip pads 1236-1 and the second chip pads 1236-2 may include address terminal pads A0 through AN, control terminal pads CE0 through CE8, and data terminal pads D0 through D31 for inputting/outputting 32-bit data. Each of the first chip pads 1236-1 and each of the second chip pads 1236-2 may include a power voltage terminal Vcc for applying power voltage and a ground terminal Vss for applying a ground voltage. Because 32-bit data is inputted/outputted through the first channel Ch. 1 and the second channel Ch. 2, the second semiconductor chip 1235 may be a 64-bit DDR chip. This 64-bit DDR chip is just one example, and other size chips may be used.

In FIG. 13, the first chip pads 1236-1 and the second chip pads 1236-2 are arranged on the left and right edge portions in two rows, respectively. However, the arrangement of the first and second chip pads 1236-1 and 1236-2 is not limited thereto.

In another example embodiment, the first chip pads 1236-1 and the second chip pads 1236-2 may be arranged in one or more rows, respectively. In addition, arranging orders of the address terminal pads A0 to AN, the control terminal pads CE0 to CE8, and the data terminal pads D0 to D31 may be arbitrarily changed according to an structure of integrated circuit in the second semiconductor chip 1235. In addition, the numbers of pads for address, control, and data, may have other values.

Figure 14:
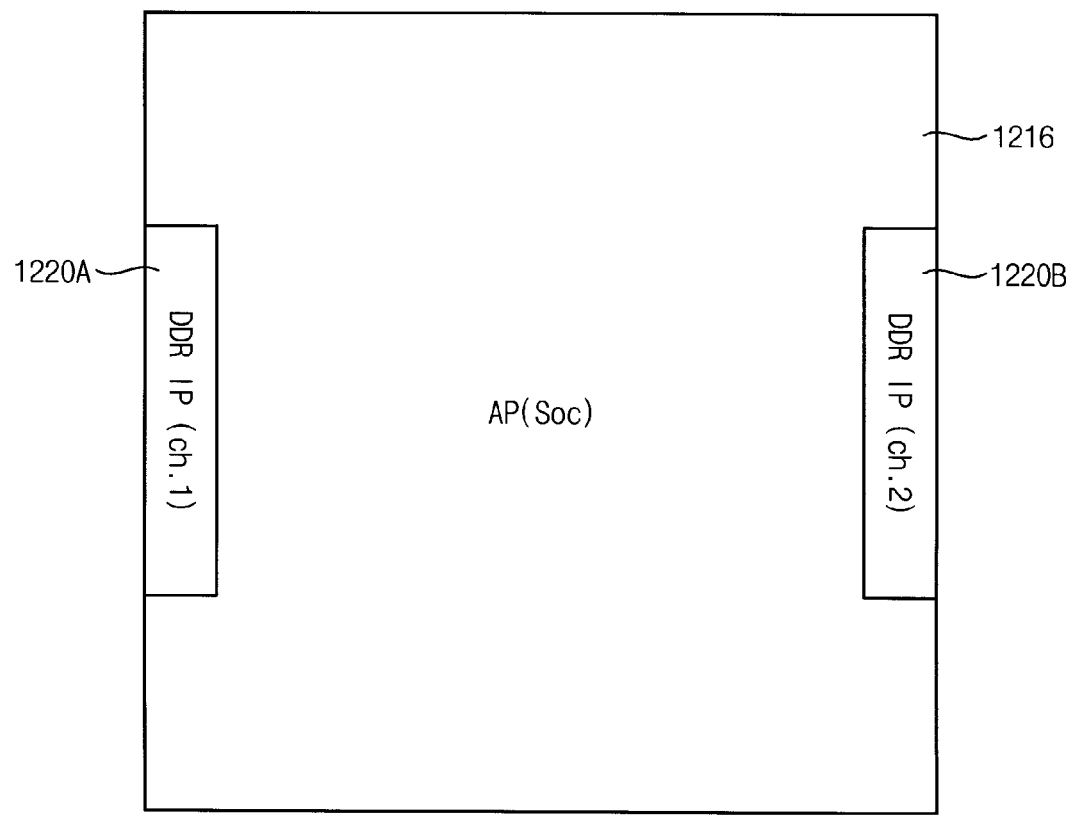
FIG. 14 is a diagram illustrating location of DDR IP core of the first package included in the semiconductor package of FIG. 12, according to an example embodiment.

FIG. 14 is a diagram illustrating location of DDR IP core of the first package included in the semiconductor package of FIG. 12, according to certain exemplary embodiments.

FIG. 14 shows a case where the first semiconductor chip 1216 is an application processor chip, and the second semiconductor chip 1235 is a DDR chip.

In the semiconductor package 1200, the DDR IP cores 1220A and 1220B in the first semiconductor chip 1216 may be disposed corresponding to the chip pads arranged on the second semiconductor chip 1235. For example, the first channel DDR IP core 1220A may be disposed on the left edge portion of the chip corresponding to the chip pads of the first channel Ch. 1, and the second channel DDR IP core 1220B may be disposed on the right edge portion of the chip corresponding to the chip pads of the second channel Ch. 2.

Figure 15:
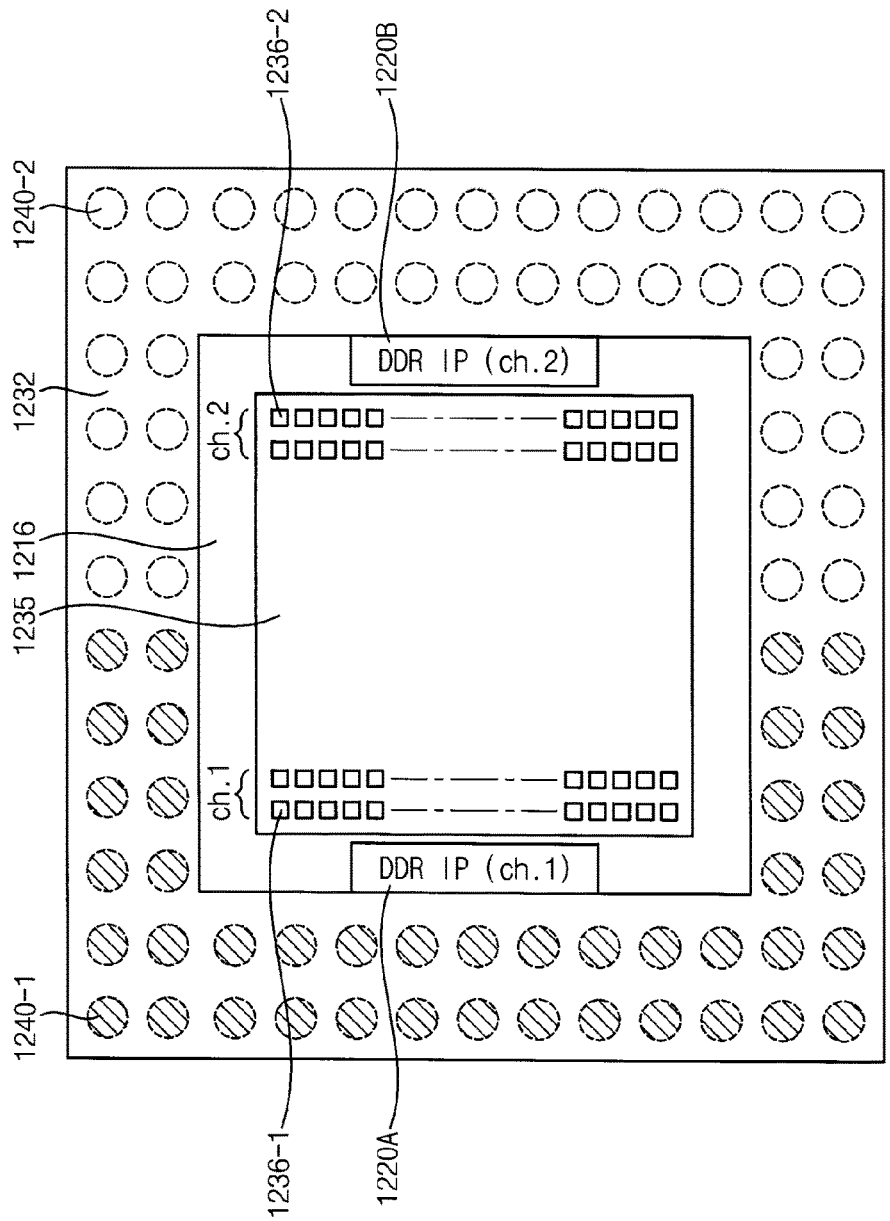
FIG. 15 is a diagram illustrating positional relationship between the first package and the second package included in the semiconductor package of FIG. 1, according to an example embodiment.

FIG. 15 is a diagram illustrating a positional relationship between the first package and the second package included in the semiconductor package of FIG. 12, according to certain exemplary embodiments.

Referring to FIG. 15, in the semiconductor package 1200, the first channel DDR IP core 1220A of the first semiconductor chip 1216 is disposed adjacent to the first channel chip pads 1236-1 of the second semiconductor chip 1235, and the second channel DDR IP core 1220B of the first semiconductor chip 1216 is disposed adjacent to the second channel chip pads 1236-2 of the second semiconductor chip 1235.

The connection member 1240 between substrates that is disposed under the second substrate 1232 on which the second semiconductor chip 1235 is mounted is shown as dashed line circle. Left hatched circles denote connection member 1240-1 corresponding to the first channel Ch. 1 and right non-hatched circles denote connection member 1240-2 corresponding to the second channel Ch. 2.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory device comprising:
   first and second memory cell arrays;
   a first controller configured to control the first memory cell array through first word line signals and first bit line signals to execute an operation corresponding to a command signal based on an address signal and a data signal; and
   a second controller including first and second mode registers, the second controller configured to write sampled values of the address signal and the command signal to the second memory cell array through access signals to form a log, and to read stored values of the second memory cell array as the data signal through the access signals in response to stored values of the first and second mode registers, the stored values corresponding to at least one of address signals and command signals,
   wherein the access signals include second word line signals and second bit line signals, and
   wherein the second controller includes:
      an address generator configured to generate a row address signal and a column address signal based on the stored values of the first and second test mode registers;
      a row decoder configured to activate a word line signal corresponding to the row address signal among the second word line signals; and
      a column decoder configured to activate some bit line signals corresponding to the column address signal among the second bit line signals, and configured to either drive the activated bit line signals as the sampled value, or receive stored values of memory cells, which are included in the second memory cell array and correspond to the row address signal and the column address signal, through the activated bit line signals and output the stored values of the memory cells as the data signal in response to the stored values of the first and second test mode registers.

2. The memory device of claim 1, wherein the second controller includes a plurality of flip-flops generating the sampled values by sampling the address signal and the command signal using a synchronization signal.

3. The memory device of claim 2, wherein the synchronization signal is a clock signal and the address signal and command signal are sampled at at least one of a rising edge and a falling edge of the clock signal.

4. The memory device of claim 1, wherein the second controller is configured to write the sampled values to the second memory cell array through the access signals when each of the stored values of the first and second test mode registers is a first logic value.

5. The memory device of claim 1, wherein the second controller is configured to read the stored values of the second memory cell array as the data signal through the access signals when the stored value of the first test mode register is a first logic value and the stored value of the second test mode register is a second logic value.

6. The memory device of claim 1, wherein the second controller and the second memory cell array do not operate when the stored value of the first test mode register is a second logic value, and
   wherein the first controller and the first memory cell array always operate irrespective of the stored values of the first and second test mode registers.

7. The memory device of claim 1, wherein the column decoder is configured to drive the activated bit lines with the sampled values when each of the stored values of the first and second test mode registers is a first logic value,
   wherein the column decoder is configured to receive the stored values of the memory cells through the activated bit line signals and output the stored values of the memory cells as the data signal when the stored value of the first test mode register is a first logic value and the stored value of the second test mode register is a second logic value.

8. The memory device of claim 1, wherein the address generator includes a counter outputting a count value,
   wherein the address generator generates the row address signal and the column address signal based on the count value and the stored values of the first and second test mode registers.

9. The memory device of claim 8, wherein the counter initializes the count value when the stored value of the first test mode register is a second logic value.

10. The memory device of claim 8, wherein the counter increases the count value sequentially at every rising edge or falling edge of a synchronization signal when the stored value of the first test mode register is a first logic value,
    wherein each of the row address signal and the column address signal increases or decreases sequentially.

11. The memory device of claim 1, wherein the command signal includes a write enable signal, a row address strobe signal, a column address strobe signal, and a chip selection signal.

12. A method of operating a memory device that includes at least a first memory cell array and a second memory cell array, the method comprising:
    controlling the first memory cell array through first word line signals and first bit line signals to execute an operation corresponding to a command signal based on an address signal and a data signal;

writing sampled values of the address signal and the command signal to the second memory cell array through access signals to form a log; and reading stored values of the second memory cell array, the stored values corresponding to at least one of address signals and command signals, wherein writing the sampled values and reading the stored values is controlled by values stored in one or more mode registers, controlling the second memory cell array through second word line signals and second bit line signals included in the access signals, and wherein controlling the second memory cell array includes:

generating a row address signal and a column address signal based on the stored values in one or more mode registers;

activating a word line signal corresponding to the row address signal among the second word line signals; and activating some bit line signals corresponding to the column address signal among the second bit line signals, and either driving the activated bit line signals as the sampled value, or receiving stored values of memory cells, which are included in the second memory cell array and correspond to the row address signal and the column address signal, through the activated bit line signals and outputting the stored values of the memory cells as the data signal in response to the stored values in one or more mode registers.

13. The method of claim 12, further comprising:

reading the stored values of the second memory cell array when a first value stored in a first mode register of the one or more mode registers is a first logic value and a second value stored in a second mode register of the one or more mode registers is a second logic value; and writing the sampled values to the second memory cell array when the first value stored in the first mode register of the one or more mode registers is the first logic value and the second value stored in the second mode register of the one or more mode registers is the first logic value.

14. The method of claim 13, further comprising:

preventing operation of the second memory cell array when the first value stored in the first mode register is the second logic value.

15. The method of claim 14, wherein the first memory cell array always operates irrespective of the values stored in the first and second mode registers.

16. The method of claim 12, wherein the controlling, reading, and writing are controlled by one or more controllers of the memory device.

17. A method of generating a log of a command signal and an address signal of a memory device, which includes a first memory cell array and a second memory cell array, comprising:

controlling the first memory cell array through first word line signals and first bit line signals to execute an operation corresponding to a command signal based on an address signal and a data signal;

writing sampled values of the address signal and the command signal to the second memory cell array through second word line signals and second bit line signals to form a log;

reading stored values of the second memory cell array, the stored values corresponding to at least one of address signals and command signals;

controlling writing of the sampled values and reading of the stored values by values stored in one or more mode registers; and controlling the second memory cell array by:

generating a row address signal and a column address signal based on the stored values in one or more mode registers;

activating a word line signal corresponding to the row address signal among the second word line signals; and activating some bit line signals corresponding to the column address signal among the second bit line signals, and either driving the activated bit line signals as the sampled value, or receiving stored values of memory cells, which are included in the second memory cell array and correspond to the row address signal and the column address signal, through the activated bit line signals and outputting the stored values of the memory cells as the data signal in response to the stored values in one or more mode registers.

18. The method of claim 17, further comprising:

reading the stored values of the second memory cell array when a first value stored in a first mode register of the one or more mode registers is a first logic value and a second value stored in a second mode register of the one or more mode registers is a second logic value; and writing the sampled values to the second memory cell array when the first value stored in the first mode register of the one or more mode registers is the first logic value and the second value stored in the second mode register of the one or more mode registers is the first logic value.

19. The method of claim 18, further comprising:

preventing operation of the second memory cell array when the first value stored in the first mode register is the second logic value.

* * * * *